United States Patent
Cousin

(10) Patent No.: US 8,928,121 B2
(45) Date of Patent: Jan. 6, 2015

(54) THERMAL STRESS REDUCTION

(75) Inventor: Alain Cousin, Caen (FR)

(73) Assignee: NXP B.V., Eindhoven (NL)

( * ) Notice: Subject to any disclaimer, the term of this patent is extended or adjusted under 35 U.S.C. 154(b) by 740 days.

(21) Appl. No.: 12/742,334

(22) PCT Filed: Nov. 7, 2008

(86) PCT No.: PCT/IB2008/054666
§ 371 (c)(1),
(2), (4) Date: May 11, 2010

(87) PCT Pub. No.: WO2009/063372
PCT Pub. Date: May 22, 2009

(65) Prior Publication Data
US 2010/0258916 A1 Oct. 14, 2010

(30) Foreign Application Priority Data
Nov. 12, 2007 (EP) .................... 07120501

(51) Int. Cl.
*H01L 29/72* (2006.01)
*H01L 23/544* (2006.01)
*H01L 21/02* (2006.01)
*H01L 21/78* (2006.01)
*H01L 49/02* (2006.01)

(52) U.S. Cl.
CPC ........ *H01L 23/544* (2013.01); *H01L 21/02005* (2013.01); *H01L 21/78* (2013.01); *H01L 28/90* (2013.01); *H01L 2223/54426* (2013.01); *H01L 2223/5446* (2013.01)
USPC ................ 257/620; 438/424; 257/E21.545; 257/E23.179

(58) Field of Classification Search
USPC ........... 257/620, E21.545, E23.179; 438/424
See application file for complete search history.

(56) References Cited

U.S. PATENT DOCUMENTS

| 4,021,751 | A | 5/1977 | Suzuki | |
|---|---|---|---|---|
| 2001/0014515 | A1* | 8/2001 | Ha et al. | 438/457 |
| 2002/0050606 | A1* | 5/2002 | Buerger, Jr. | 257/202 |
| 2003/0216009 | A1 | 11/2003 | Matsuura et al. | |
| 2005/0127423 | A1* | 6/2005 | Hsu | 257/301 |

(Continued)

FOREIGN PATENT DOCUMENTS

| JP | 02-181425 | * 7/1990 |
|---|---|---|
| JP | 2002-134451 | 10/2002 |
| WO | 2005/088699 A1 | 9/2005 |

OTHER PUBLICATIONS

Hogervorst, R., et al; "Low-Powr Low-Voltage VLSI Operationa Amplifier Cells"; pp. 19-47 (Jan. 1, 1996).

*Primary Examiner* — Edward Wojciechowicz

(57) ABSTRACT

The present invention relates to a method for thermal stress reduction on a wafer, comprising the steps of providing a patterned wafer with saw lanes between adjacent dies, forming thin holes within the silicon substrate, which holes create a dotted groove in the saw lanes, and wherein no second layer on an opposing side of the wafer is formed, a patterned wafer obtained by said method. The forming of the holes is preferably combined with other processing steps or another step to avoid additional operations and manipulations prior to, or after standard wafer processing, and it therefore optimizes fabrication quality and costs. Preferably the holes within the silicon substrate having a depth of more than 3 to 50 μm, preferably from 5-40 μm, like 20 μm.

20 Claims, 4 Drawing Sheets

(56) References Cited

U.S. PATENT DOCUMENTS

| | | |
|---|---|---|
| 2005/0194670 A1 | 9/2005 | Kameyama et al. |
| 2005/0269702 A1 | 12/2005 | Otsuka |
| 2007/0057349 A1 | 3/2007 | Yang |
| 2007/0176181 A1* | 8/2007 | Kusunoki .................. 257/79 |
| 2008/0061402 A1* | 3/2008 | Ishihara et al. ............ 257/621 |

* cited by examiner

STANDARD N-TYPE Si SUBSTRATE

RIE ETCHING

ONO + PS DEPOSITION

OXIDE DEPOSITION

OXIDE OPENING + FIRST METAL

THERMAL STRESS REDUCTION

FIELD OF THE INVENTION

This invention relates to thermal stress reduction on a wafer and a wafer with reduced thermal stress.

BACKGROUND OF THE INVENTION

Stress is a constant presence in the semiconductors manufacturing. It can cause wafers to become warped and less manageable, and in worst cases it can even cause breakage of wafers.

Methods of reducing thermal stress are disclosed in the prior art.

JP 02-181425 discloses plural sets of pinhole shaped through holes, which are made in advance. These holes are formed in scribe lanes on the wafer. Thereto an etch process is used.

However, an etch process, such as a RIE process, provides for a speed of 1 to 10 µm per minute, on a wafer that typically is 300 to 400 µm thick. Therefore the cost involved is quite high, especially in view of the small number of holes that are formed.

Clearly the time involved for etching is quite long, which makes the process unfavorable, also in terms of costs allocated to use of equipment, chemicals, and environmental and health risks. Furthermore, even wafers comprising plural sets of through holes suffer from warpage, albeit at a lower extend.

JP 2002-134451 discloses grooves that are formed on dicing streets used in an assembly process by etching in a plasma treatment, in order to reduce warpage before the grinding process.

This clearly means that all process steps before that final operation, i.e. grinding, including wafer test, have been done on a potentially warped wafer. Further, performing a plasma treatment on a finished wafer, if not perfectly controlled, could damage adjacent sensitive structures on the integrated circuits US2001/0014515 discloses a method of preparing a semiconductor wafer, including the step of forming first and second layers of a first material on opposing respective first and second faces of the semiconductor wafer. The second layer of the first material is then removed from the second face of the semiconductor wafer. More particularly, the first material can be polysilicon. Herein, rectangular grooves running over the length of a wafer are formed, or separate grooves in at least one of the scribe lanes, which are processed with specific mask layers and patterning within scribe lines. The depth of the grooves is claimed to help reduce the possibility that the grooves are buried during the formation of the integrated circuit devices. The depth of the grooves is preferably greater than total thickness of the layers deposited.

US2003/0216009A1 discloses a method for preventing warpage of wafers, wherein grooves for attenuating warp are formed in scribe regions, except in the scribe regions such that the alignment pattern forming regions remain in the scribe region.

Thus, grooves are formed, which are continuous. A disadvantage hereof is that the necessity to interrupt grooves in the alignment pattern regions exists. Further, stress reduction is less effective when a groove does not run all over the wafer.

US2005/0194670A1 discloses a method for preventing warpage of wafers, wherein a glass substrate is bonded on a surface of a silicon wafer formed with pad electrodes. Next, via holes are formed from a back surface of the silicon wafer to pad electrodes, and a groove is formed extending along a center line of a dicing line and penetrating the silicon wafer from its back surface.

This method is regarded as being expensive and rather complicated.

Thus there still is a need for a method for preventing warpage on a wafer which is simple, efficient in terms of process time, the amount of chemicals used, which should not involve extra process steps, which is environmental friendly, and relatively safe.

SUMMARY OF THE INVENTION

The present invention relates to a method for thermal stress reduction on a wafer, comprising the steps of providing a patterned wafer with saw lanes between adjacent dies, forming thin holes within the silicon substrate, which holes create a dotted groove in the saw lanes, and wherein no second layer on an opposing side of the wafer is formed, a patterned wafer obtained by said method.

DETAILED DESCRIPTION OF THE INVENTION

In a first embodiment the invention relates to a method for thermal stress reduction on a wafer, comprising the steps of:

providing a wafer with an alignment pattern and saw lanes between adjacent dies, forming thin holes within the silicon substrate, which holes create a dotted groove in the saw lanes, wherein no second layer on an opposing side of the wafer is formed.

In order to be able to define dies on a wafer, an alignment pattern for lithographic equipment needs to be present.

Whenever the term "saw lanes" is used, it also refers to scribe lanes or scribe lines.

Further, it is not necessary that the saw lanes have already been physically defined on the wafer. Actually, and preferably, the saw lanes may also be virtually present, that is, the holes which are formed by the present method, are formed at locations, where in subsequent process steps the saw lanes are formed. As such, the holes would be present "underneath" saw lanes, that is in a vertical direction being closer to the substrate, such as silicon.

The forming of the holes is preferably combined with other processing steps or another step to avoid additional operations and manipulations prior to, or after standard wafer processing, and it therefore optimizes fabrication quality and costs.

Preferably the holes within the silicon substrate having a depth of more than 3 to 50 µm, preferably from 5-40 µm, like 20 µm. These holes can be formed within a relative short time, i.e. within a few minutes time, which is an advantage in terms of process time, but also in terms of amount of chemicals used, safety and environmental aspects. Further, such a process can therefore easily be integrated in an existing process.

Preferably the holes have a 3 to 10 µm diameter, such as 5 to 8 µm. The holes are preferably being circular, though other more or less circular forms are also envisaged, such as decagonal, octagonal, and hexagonal. The diameter of the holes should not be too small, as than a smaller effect or no effect is observed in terms of stress reduction. The diameter of the holes need not be too large, as no extra stress reduction is observed. Further, in terms of lithographical processes and etch processes a more or less circular shaped hole is preferred.

Preferably the holes have a two-dimensional pitch in the range of 3 to 20 µm, such as 5 to 15 µm, more preferably 10 µm. The pitch need not be too small, as than a smaller effect or no effect is observed in terms of stress reduction. The pitch of the holes need not be too large, as no extra stress reduction is observed. Further, the pitch in a first dimension need not be equal to the pitch in a second dimension. Thus, the pitch in a first dimension may be relatively small, such as 3 to 8 μm, whereas the pitch in a second dimension may be relatively large, such as 12 to 18 μm. The pitch may also be adapted taking into account the actual dimensions of the saw lane, and may be optimized within said terms.

As such, the holes create a dotted groove-like form in the saw lanes. Etching thin holes with low pitch create dotted grooves, contrary to continuous or segmented grooves.

A further advantage is that compared to the prior art dotted groove ease die separation during expansion, i.e. no die cracks are formed, of the foil after a grinding process.

The holes are preferably formed using an etching technique, preferably a dry etching technique. A known technique to drill thin holes in silicon is Reactive Ion Etching (RIE). This technique is usable in a front-end wafer process. A laser beam is another known technique to form holes, but generally it is used in a back end process and it is combined with grinding (e.g. on Disco equipments).

Using RIE the formation of holes may be combined with a Passive Integration Process, which is called PICS (for Passive Integration Connected Substrate). The process realizes dense tri-dimensional so-called EXSTC capacitors (EXtreme STorage Capacity structure). It generates a capacitor density of up to 20 nF per $mm^2$ and more, which densities can be achieved using such a technique.

Thus compared to the prior art the present process is by far faster and cheaper, as well as cleaner, due to the fact that stress is induced in a thickness of few microns. Etching can therefore be limited in depth to e.g. 3 to 50 microns, whereas the warpage or stress of wafers is still adequately limited or prevented by said etching. Furthermore experiments have revealed that many thin holes at the present low pitch, all over the wafer, will give better results than plural sets of through holes.

It is observed that reduction of convex warping of the present dotted groove is comparable to or better than warping of continuous or segmented grooves, having a similar depth, as long as the pitch is low enough.

In a preferred embodiment in the present method the steps of providing a wafer and forming holes (steps i) and ii)) are performed before forming metal layers in subsequent steps, preferably before depositing an interlayer dielectric an a subsequent step.

Thus, such as method is preferably performed in an early stage of the process of manufacturing wafers. The present process reduces thermo-mechanical stress induced in the wafer during next operations like depositions, temperature cycling and other process manufacturing steps, and also at the end of the manufacturing during grinding and sawing of the wafer. As the anti warpage is performed at the very beginning of the process, the wafer is flat during all subsequent process steps, including wafer test and grinding, which is another advantage.

In a preferred embodiment the holes are capped with oxynitride, preferably before forming an integrated circuit, most preferably before forming alignment patterns.

As a consequence, such capped thin holes with oxide nitride maintain to comprise voids. Therefore, during the subsequent process steps, the holes contribute fully in preventing warpage, whereas holes that are filled or partly filled loose some of their function, in this respect. Further, as mentioned above, making holes, instead of continuous or segmented grooves, reduces process time; Capping of holes further solves the problem of buried grooves during the formation of the integrated circuit devices in subsequent processing steps.

The capping of the present dotted grooves is preferably carried out after etching, by an oxide or nitride or other suitable material, in order to keep them empty during following processing steps, wherein integrated circuits are formed.

It is noted that as a further advantage on top of the present capped dotted grooves alignment patterns are implemented, as may be the case in a standard process, which alignment patterns can be easily "read" by equipment as usual.

In a preferred embodiment the holes are etched at the same time as capacitors are. For instance, in a process technology like PICS, the etching of holes in the saw lanes can be performed at the same time as the EXSTC capacitors are formed. The advantage thereof is to no extra process step is involved, and thus no extra process time is needed, no extra cost for fabrication is involved, no extra chemicals need to be used, and thus no extra burden on the environment is placed.

In a second aspect the invention relates to a patterned wafer comprising saw lanes with thin holes within the silicon substrate forming a dotted groove, wherein the holes have a depth of more than 3 to 50 μm, preferably from 5-40 μm, like 20 μm, and preferably having a 3 to 10 μm diameter, preferably being circular, and preferably having a two dimensional pitch in the range of 3 to 20 μm, preferably 10 μm, wherein preferably substantially all available saw lanes comprise said holes, and wherein preferably the area in the available saw lanes is substantially covered with said holes, and wherein no second layer on an opposing side of the wafer is present.

It is noted that the present invention further provides advantages when actually sawing the wafer. Due to the dotted grooves it becomes easier to saw the dies.

The present invention is further elucidated by the following figures and examples, which are not intended to limit the scope of the invention. The person skilled in the art will understand that various embodiments may be combined.

DETAILED DESCRIPTION OF THE DRAWINGS

FIGS. 1A-1E is a series of figures depicting a process flow of manufacturing the present holes. Herein cross sections of a wafer are given. Clearly real dimensions are not respected, the figures are merely illustrative.

FIGS. 1A-1E show, as an extra feature, how to combine fabrication of dotted grooves in scribe lines, according to the present invention, and known process steps used to make XSTC capacitors, such as in a PICS process. In our view it is a simple and cheap solution, but clearly not the sole one to realize the present invention.

Figure 1A:
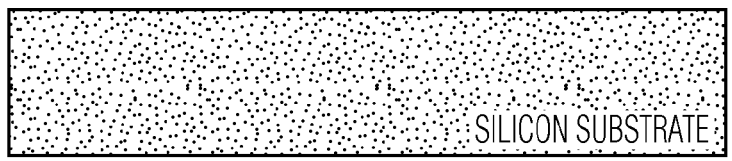
FIGS. 1A-1E illustrate, in a side-view, a process flow according to an embodiment of the present disclosure.

In FIG. 1A a substrate is provided. The substrate typically is a silicon substrate, but may also be a SOI substrate. Typically a standard N− Si substrate cross section (600 to 700 microns thick) is provided. First processing steps consisting of first oxidation, lot routing, mask alignment, are realized on steppers like e.g. those of ASML.

Figure 1B:
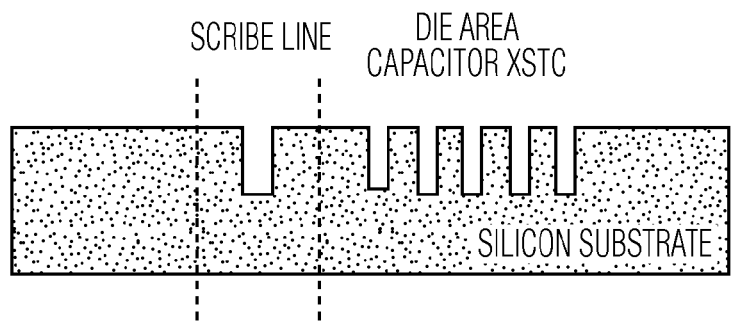

In FIG. 1B an alignment pattern, for lithographic purpose, is provided. It is possible to combine implementation of holes, which are later capped, in scribe lines with XSTC capacitor fabrication steps. It is noted that holes need not be capped. Here RIE etching is used to define both the holes and the capacitors. RIE etching process step is done on e.g. Alcatel equipment: Etching is processed by alternating etching and passivation steps according the known "BOSCH process" (Pulsed chemistry), wherein in Step 1 Etching is performed with $SF_6$, and in step 2 a passivation layer deposition is performed with $C_4F_8$. For simplification holes for XSTC capacitors and those in scribe lines are chosen as having the same depth (in this case 20 μm). Other depths, such as 3 μm, 10 μm, 40 μm and 50 μm have also been made.

The diameter of the holes in scribe lines is chosen a bit larger than the one for the capacitor. In a subsequent step, as a consequence, the PS completely fills the capacitor pits, but not the holes in the scribe lines. A very thin dielectric OxideNitrideOxide (ONO), of 0.0035 μm total thickness, is deposited in all holes (capacitors and holes in scribe lines) using atmospheric and LPCVD furnaces.

Figure 1C:
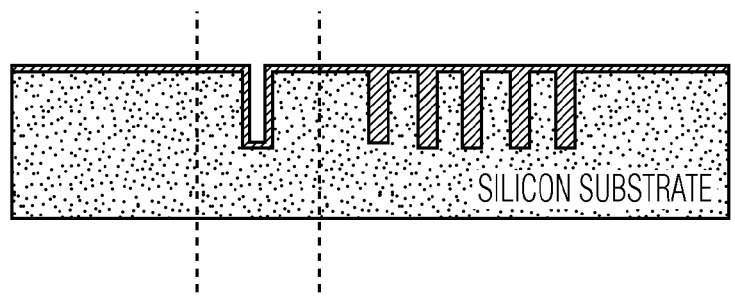

In FIG. 1C an in situ N+Si doping of the lower capacitor electrode is provided, followed by an ONO thin dielectric deposition, and finally PS deposition, of around 0.8 μm, is applied to create the top electrode of the capacitor, and the core of resistors in other parts of the integrated circuit. For deposition an LPCVD process is used.

Figure 1D:
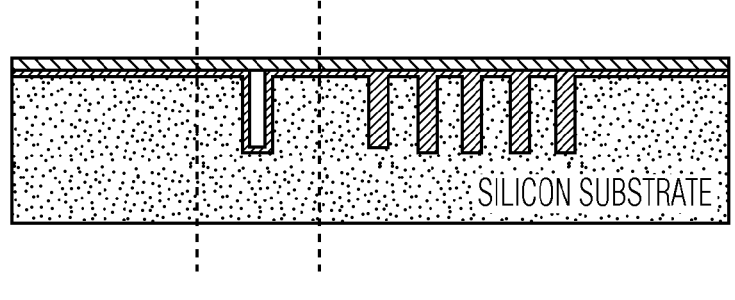

In FIG. 1D an oxide or oxinitride deposition is performed, to cap holes in scribe lines and contact openings (CO) on "bottom" and "top" capacitor electrodes. The oxide is deposited by LPCVD and has a thickness of around 0.3 μm.

Figure 1E:
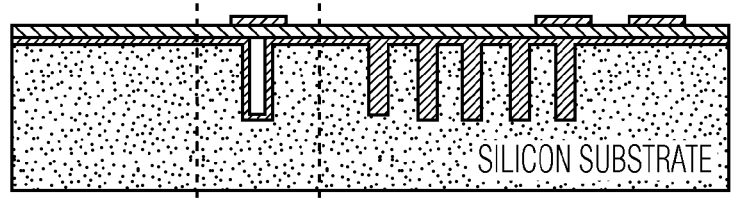

In FIG. 1E a metal deposition is performed. The metal deposition is not particularly relevant for holes but is related to the formation of electrical interconnections used to connect the capacitor electrodes to other passive (resistors, inductors) or active (transistors) components of the integrated circuit. As an example, a plug to PS for the capacitor (right), and an element of a pattern alignment in scribe line above the oxide cap (left), are represented.

Figure 2:
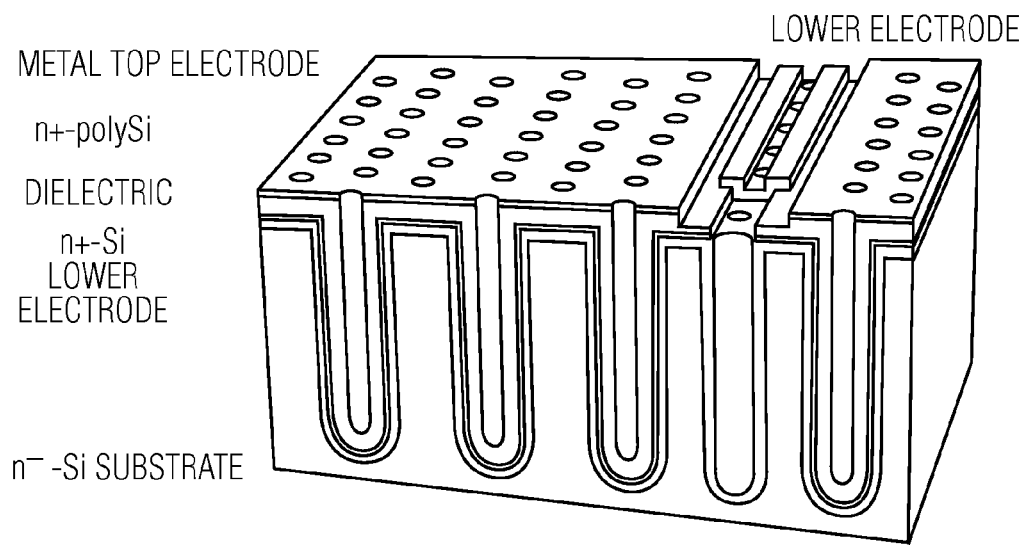
FIG. 2 is an illustration of an EXST capacitor in a PICS process according to an embodiment of the present disclosure.

In FIG. 2 an EXSTC capacitor cross section is shown. Therein, RIE was used to make a matrix of thin holes in an n− substrate. It is noted that n+Si constitutes the first electrode of the capacitor. A combination of oxide+nitride+oxide (ONO) thin layers constitutes a dielectric layer, with a total thickness of 350 angstrom (0.035 μm). Further, n+ Poly Silicon (PS) constitutes the second electrode of the capacitor. Shown are top and lower aluminum electrodes, which allow the connection of the capacitor to other passives components (such as R and L), which passive components may be implemented on the same (passive) substrate.

It is noted that generally in a PICS process, as the name of the process indicates, there are no active components (like diodes or transistors).

Further, we note that in contrary to the "artistic" view above in reality the pits should be fully filled with PS, to avoid problems with subsequent process steps (such as lithography. And the lower electrode is not connected via empty (no PS) pits, but with a direct plug to n+Si.

Thus the advantages of the present invention are e.g. simplicity and low cost of manufacture, wherein further the forming of the present dotted groove in saw lanes can be made during the same process steps, as those forming the EXSTC capacitors.

Further it is noted that the RIE technique is known technique in back end operation, but needs a special process step in a front-end operation. The big advantage of the present invention is, in the case of PICS process, that it can be realized for free, because RIE is performed anyway and at the same stage.

For other than PICS processes the present invention can be used under the condition to add a RIE process step in the front-end process, preferably prior to subsequent metalization steps.

In the proposed present invention, holes implemented in saw lanes, contrary to the EXSTC capacitor ones, are kept at least partly free of material, such as oxide, that is deposited during subsequent processing steps, by capping them. As such, they really contribute to thermo-mechanical stress release.

Figure 5:
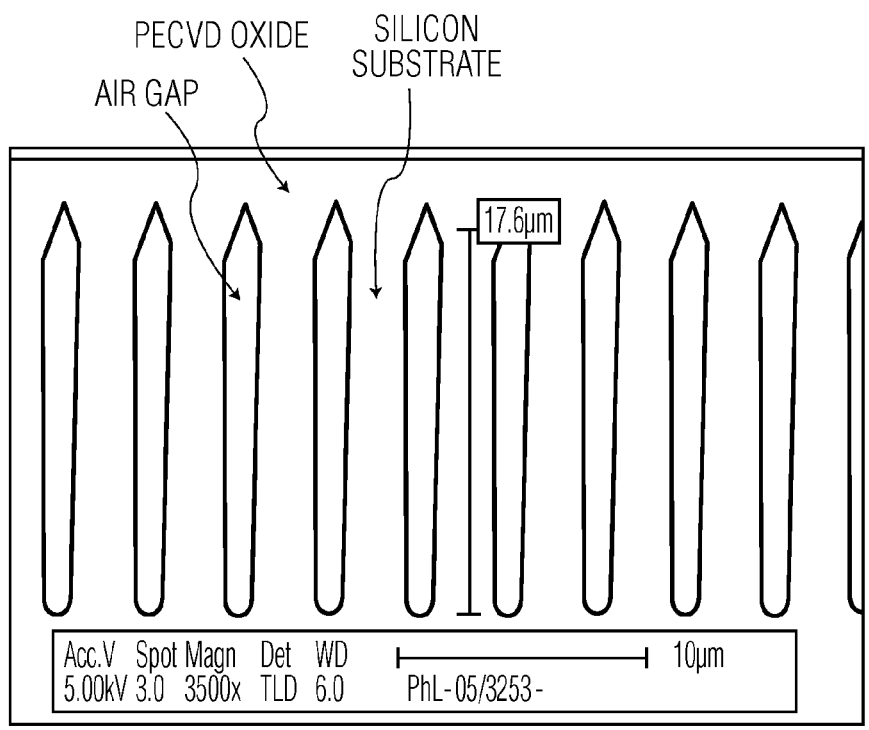
FIG. 5 shows a cross section of a substrate with capped holes therein.
Figure 6:
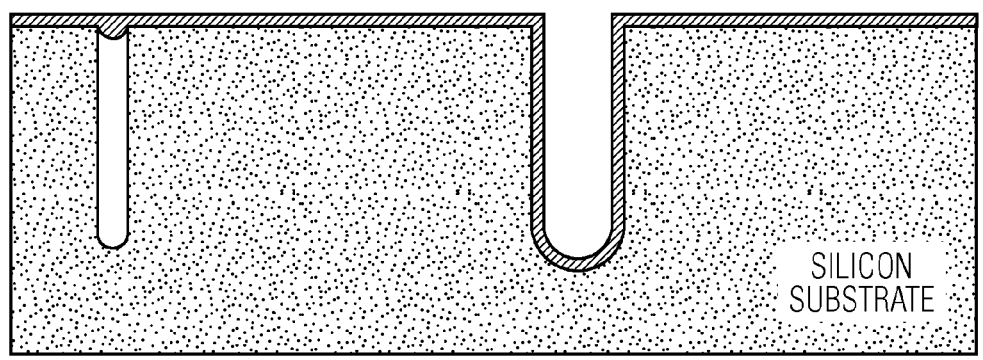
FIG. 6 shows a cross section showing a fine hole closed by oxide and an open larger one.

A solution is to make holes thin enough, so that during oxide deposition they will be capped, and not filled, as is illustrated in FIG. 6. The present invention specifically relates to forming a fine hole having a free space of 1 to 2 mm diameter, and cap it on top by Oxinitride or as an alternative by benzocyclobutene (BCB). A SEM cross-section of a substrate with fine holes capped with PECVD oxide is shown in FIG. 5. Herein, the holes are clearly visible. Also the pitch, diameter and depth of the holes are indicated.

Another solution is to fill holes with a temporary protective product, such as PEG (Poly Ethylene glycol), though at a cost of adding a process step. In this case the holes diameter can then be bigger (such as 10-20 μm or more).

A third solution is to let holes open and use a 3D lithography equipment.

The present invention specifically relates to forming a fine hole, having a diameter, which is at least equal to 2 times the PS+ONO thickness, plus a free space of 1 to 2 μm diameter, and close it on top at a CO process step, or at a BCB opening step in case benzocyclobutene is used instead of Oxinitride. This gives an initial RIE diameter of approximately 3 μm. A possible solution to close fine holes with oxide is shown in FIG. 5.

A process step wherein holes in the saw lane are etched and are later capped or are not capped, is process flow dependent, but etching should preferably be performed before interconnection levels. If RIE etching is already an operation envisaged in the process flow, than it can be utilized to make dotted grooves in saw lane. If RIE etching is not already an operation envisaged in the process flow, then it needs to be added at its beginning.

Capping or not capping the holes is dependant upon the lithography used (2D or 3D). In a wafer fabrication process, typically 2D lithography will need capping, whereas typically 3D lithography will not.

As an example, in the PICS process, one possibility is to etch holes in the saw lanes during the RIE capacitor definition steps, and capped them after ONO and PS process steps.

Doing this way do not involve modifications on the existing standard PICS process, and do not impact fabrication costs.

The holes diameter is typically large enough to receive the PS, oxide and passivation layers, and further leave enough space to create the present dotted groove. It can be kept open during front-end processing, though a 3D lithography equipment should be used in that case. 3D lithography equipment allows process lithography on a wafer having cavities, trenches, grooves, etc. So when the present dotted grooves are created at the beginning of the wafer process, it is not necessary to cap them for the following operations, as is the case like conventional (2D) equipment.

Figure 4:
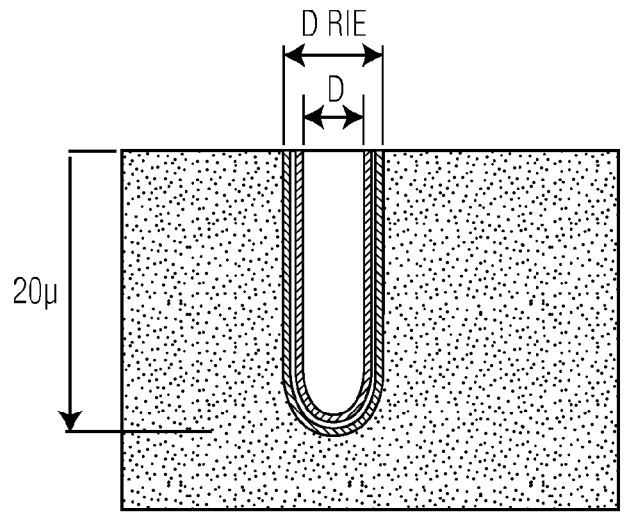
FIG. 4 shows a cross section of a hole.

With respect to FIG. 4, a first possibility for capping is as follows:

The hole diameter after etching in saw lanes (DRIE) and free space diameter after ONO and PS (D) are linked with the following formula With respect to FIG. 4

$$D = D\text{ RIE} - 2(t\text{ ONO} + t\text{ PS});$$

in which t ONO and t PS are the thickness of ONO and PS depositions, (0.035 μm and 0.8 μm, respectively). To cap the holes with oxide, and not to fill them, D should in this example be 1 to 2 μm and therefore D RIE in saw lanes should be 3 μm.

Another solution is to fill holes with a temporary protective product prior oxinitride deposition, such as PEG (Poly Ethylene glycol), though it is at a cost of adding a process step. In this case the holes D RIE diameter can then be bigger than in the previous proposed solution (such as 10-20 μm or more).

A third solution is to let holes open and use a 3D lithography equipment. It can be kept open during front-end processing, though a 3D lithography equipment should be used in that case. 3D lithography equipment allows process lithography on a wafer having cavities, trenches, grooves, etc. So when the present dotted grooves are created at the beginning of the wafer process, it is not necessary to cap them for the following operations, as it is the case like with conventional (2D) equipment.

Figure 3A:
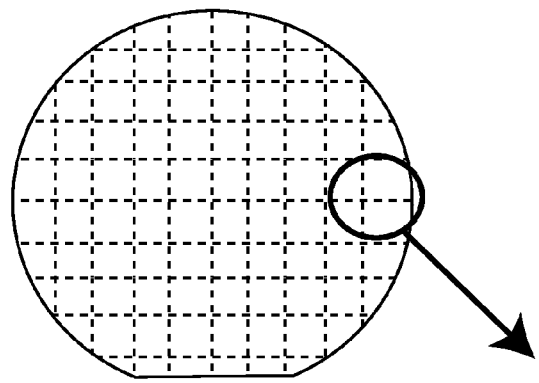
FIG. 3A-3B show in a top-view and in a side-view the drilled holes in saw lanes present on the patterned side.
Figure 3B:
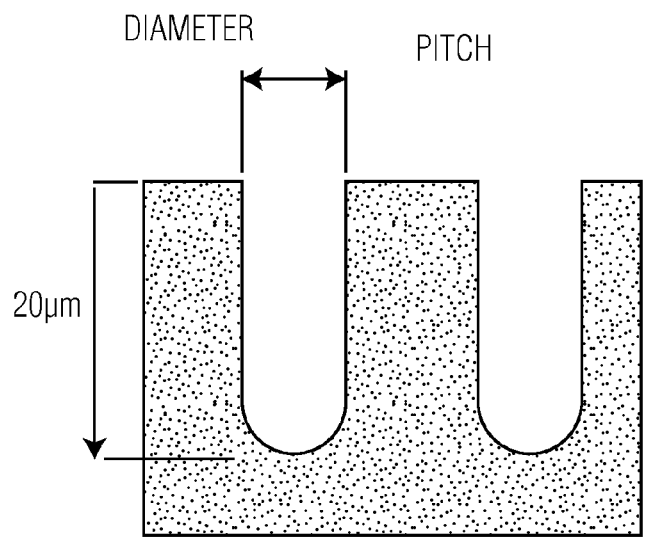

FIG. 3A shows a wafer top view, indicating the saw lane locations. FIG. 3B is a cross section of drilled holes in the saw lanes on the patterned side of the wafer.

The invention claimed is:

1. A method for thermal stress reduction on a wafer, comprising the steps of:
   (i) providing a wafer having a silicon substrate;
   (ii) forming thin holes extending partially into the silicon substrate, the holes having a depth of in the range of about 3 μm to about 50 μm and having a diameter in the range of about 3 μm to about 10 μm, said holes creating dotted saw lanes between adjacent dies in the silicon substrate; and
   (iii) wherein no second layer on an opposing side of the wafer is formed.

2. The method as recited in claim 1, further including forming at least one metal layer on the wafer after performing steps i) and ii).

3. The method as recited in claim 1, wherein forming the thin holes includes forming thin holes having a diameter that mitigates filling of the holes with insulating material formed thereupon, further comprising capping the holes with an insulating layer of the insulating material without filling a majority of each hole with the insulating material, by using the diameter of the holes to mitigate the formation of the insulating material therein.

4. The method as recited in claim 1, wherein forming the thin holes includes etching the holes, further including
   etching additional holes for capacitor circuits in the wafer at the same time that the thin holes are etched for creating the saw lanes, and
   forming capacitor circuits in the additional holes.

5. A patterned wafer comprising:
   a plurality of thin holes extending from a surface of a silicon substrate at least partially into the silicon substrate, the thin holes forming dotted saw lanes between respective dies, the holes having a depth in the range of about 3 μm to about 50 μm and being configured and arranged with a diameter of about 3 μm to about 10 μm that, during oxide deposition prevents oxide from filling substantially any of the holes; and
   wherein no second layer on an opposing surface of the wafer is present.

6. The method as recited in claim 3, wherein the insulating layer is at least one of the following: oxynitride, bezocyclobutene.

7. The method as recited in claim 1 wherein, the holes have a two-dimensional pitch in the range of about 3 μm to about 20 μm.

8. The method as recited in claim 1, wherein the holes are formed by reactive ion etching (RIE).

9. The method as recited in claim 3, further including, after the step of capping the holes with an insulating layer, at least one of the steps of forming components of an integrated circuit or depositing an interconnect metal layer in the silicon substrate.

10. The method as recited in claim 9, wherein components of the integrated circuit include transistors, further including using portions of the thin holes that are not completely filled with the insulating material to mitigate thermal stress and warping of the wafer while forming the components of the integrated circuit or depositing the interconnect metal layer and while separating the dies along the saw lanes.

11. The method as recited in claim 1, wherein the depth of the thin holes is in the range of about 5 μm to about 40 μm.

12. The method as recited in claim 7, wherein the depth of the thin holes is in the range of 5 μm to about 40 μm.

13. The patterned wafer as recited in claim 5, wherein the holes have a two-dimensional pitch in the range of about 3 μm to about 20 μm.

14. The patterned wafer as recited in claim 5, wherein substantially all available saw lanes on the wafer comprise said holes.

15. The patterned wafer as recited claim 5, wherein the respective saw lanes are defined by a width of the holes and a length of a surface of the silicon substrate, and wherein the area in the saw lanes is substantially covered with said holes.

16. The patterned wafer as recited in claim 15, wherein the depth of the thin holes is about 20 μm and wherein the two-dimensional pitch of the holes is about 10 μm.

17. The patterned wafer as recited in claim 16, wherein the thin holes are substantially circular.

18. A patterned wafer comprising:
   a silicon substrate;
   substantially circular thin holes within the silicon substrate forming dotted saw lanes in the silicon substrate, the holes have a depth of about 20 μm and a diameter of about 3 μm to about 10 μm;
   a capping layer of insulating material covering the thin holes, at least a portion of the capped thin holes defining a gap that is free of the material; and
   wherein substantially all available saw lanes extend between adjacent dies in the silicon substrate comprise said holes, and
   wherein the thin holes are configured and arranged with the respective gaps to mitigate thermal stress in the patterned wafer and therein resist warping during subsequent processing steps, prior to the adjacent dies being separated and while the adjacent dies are separated along the saw lanes.

19. The patterned wafer as recited in claim 18, wherein the holes have a two-dimensional pitch of about 10 μm.

20. The patterned wafer as recited in claim 19, wherein the respective saw lanes are defined by a width of the holes and a length of a surface of the silicon substrate, and wherein the area in the available saw lanes is substantially covered with said holes.

* * * * *